United States Patent
Nagata et al.

(10) Patent No.: US 11,967,634 B2
(45) Date of Patent: Apr. 23, 2024

(54) SEMICONDUCTOR DEVICE AND METHOD OF MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Kensuke Nagata, Nisshin (JP); Yohei Iwahashi, Nisshin (JP); Ryota Suzuki, Nisshin (JP); Katsuhiko Hamasaki, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 20 days.

(21) Appl. No.: 17/824,236

(22) Filed: May 25, 2022

(65) Prior Publication Data
US 2022/0384621 A1 Dec. 1, 2022

(30) Foreign Application Priority Data
May 28, 2021 (JP) .................. 2021-090106

(51) Int. Cl.
*H01L 29/66* (2006.01)
*H01L 29/423* (2006.01)
*H01L 29/808* (2006.01)

(52) U.S. Cl.
CPC .... *H01L 29/66893* (2013.01); *H01L 29/4236* (2013.01); *H01L 29/808* (2013.01)

(58) Field of Classification Search
CPC ............. H01L 29/7813; H01L 29/7825; H01L 29/66613–66628; H01L 29/42336; H01L 29/42352; H01L 29/4236; H01L 29/42356; H01L 29/66734; H01L 21/82285; H01L 21/823487; H01L 21/823885;
(Continued)

(56) References Cited

U.S. PATENT DOCUMENTS

2019/0157437 A1* 5/2019 Matsui ................ H01L 29/0619

FOREIGN PATENT DOCUMENTS

JP 2020-109808 A 7/2020

* cited by examiner

*Primary Examiner* — Moin M Rahman
(74) *Attorney, Agent, or Firm* — POSZ LAW GROUP, PLC

(57) ABSTRACT

A semiconductor device includes a semiconductor element. The semiconductor element has a semiconductor layer, a first-conductivity-type layer, a saturation current suppression layer, a current dispersion layer, a base region, a source region, trench gate structures, an interlayer insulation film, a source electrode, a drain electrode, and a second deep layer. The first-conductivity-type layer is disposed above the semiconductor layer. The saturation current suppression layer disposed above the first-conductivity-type layer includes a first deep layer and a JEFT portion. The base region is disposed above the saturation current suppression layer. The source region and the contact region are disposed above the region. Each of the trench gate structures has a gate trench, a gate insulation film, and a gate electrode. The second deep layer is disposed among the trench gate structures and is connected to the first deep layer.

7 Claims, 11 Drawing Sheets

(58) Field of Classification Search
CPC .......... H01L 27/0821; H01L 27/0828; H01L 27/10864; H01L 27/10876; H01L 29/66272; H01L 29/66666; H01L 29/66674; H01L 29/66712; H01L 29/732; H01L 29/7327; H01L 29/7371; H01L 29/7395; H01L 29/7788; H01L 29/7827; H01L 29/78642; H01L 29/7889; H01L 29/7926; H01L 29/8083; H01L 29/8122; H01L 29/66431; H01L 29/66462; H01L 29/7832; H01L 2924/13062; H01L 29/1066; H01L 29/66901–66909; H01L 29/66916; H01L 29/1058; H01L 29/66893–66924; H01L 29/8086; H01L 27/098; H01L 27/14679; H01L 29/04–045; H01L 29/16–1608; H01L 29/18–185; H01L 29/22–2206; H01L 29/36–365; H01L 27/092–0928; H01L 29/66477–6684; H01L 29/78–7926; H01L 29/1033–1054; H01L 29/20–2006; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22

See application file for complete search history.

ously high; and
SEMICONDUCTOR DEVICE AND METHOD OF MANUFACTURING THE SAME

CROSS REFERENCE TO RELATED APPLICATIONS

This application is based on Japanese Patent Application No. 2021-090106 filed on May 28, 2021, the disclosure of which is incorporated herein by reference.

TECHNICAL FIELD

The present disclosure relates to a semiconductor device including a semiconductor element, and further relates to a method for manufacturing the semiconductor device.

BACKGROUND

A semiconductor device may include a semiconductor element with a trench gate structure that may inhibit a surge voltage or element breakdown.

SUMMARY

The present disclosure describes a semiconductor device including a semiconductor element having multiple trench gate structures, and further describes a method for manufacturing the semiconductor device including formation of multiple trench gate structures.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
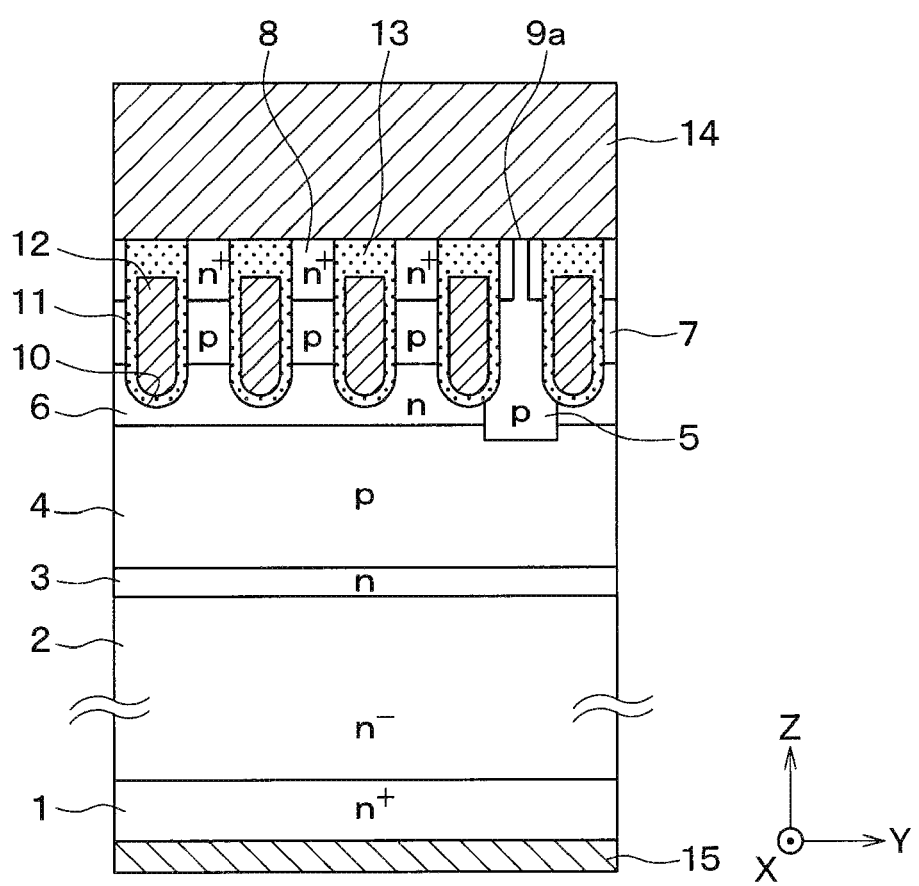
FIG. 1 is a diagram showing a cross-sectional configuration of a SiC semiconductor device according to a first embodiment.

In a semiconductor device provided with a semiconductor element having a trench gate structure, when the drain voltage rises to a high voltage in a structure in which a p-type electrical field block layer is formed below the trench gate structure to obtain a withstand voltage while obtaining a low saturation current and low on-resistance, the electrical field block layer is completely depleted. As a result, when the drain voltage rises to a high voltage, the feedback capacitance can be increased and a change in the drain current can be reduced by an enlarging capacitance between the gate and drain. Therefore, it is possible to reduce the surge voltage and inhibit the element breakdown caused by the surge voltage. In addition, it is possible to protect the gate insulating film from a high electrical field by completely depleting the electrical field block layer.

In a semiconductor device with such a structure as described above, since the electrical field block layer needs to have a potential identical to a source potential, a p-type semiconductor for connection is used for connecting a region between the base region and the electric block layer for forming a channel region at a side surface of a trench.

However, as the spacing between adjacent two of the trenches included in the trench structure becomes narrower, a variation in the on-resistance and threshold voltage caused by a shift in the forming position of the p-type semiconductor for connection may become larger. The p-type semiconductor for connection is formed to be separated from the trench by a predetermined distance. However, a shift in the forming position may occur in the formation of the p-type semiconductor through, for example, ion implantation. In this situation, for example, if the p-type semiconductor for connection is in contact with the side surface of the trench, the concentration of p-type impurities in the contact portion becomes higher than the concentration in the base region. Therefore, the area where the MOSFET operation is performed varies depending on whether or not a shift in the forming position of the p-type semiconductor occurs and the on-resistance Ron fluctuates. Due to the shift in the forming position, the concentration of p-type impurities in the base region is substantially increased in the portion where the p-type semiconductor for connection is formed. Therefore, it may lead to an increase in the variation of the threshold voltage Vth.

According to a first aspect of the present disclosure, a semiconductor device includes a semiconductor element. The semiconductor element includes a semiconductor layer, a first-conductivity-type layer, a saturation current suppression layer, a current dispersion layer, a base region, a source region, a contact region, trench gate structures, an interlayer insulation film, a source electrode, a drain electrode and a second deep layer. The semiconductor layer has a first conductivity type or a second conductivity type. The first-conductivity-type layer is disposed above the semiconductor layer, and has the first conductivity type with an impurity concentration lower than an impurity concentration of the semiconductor layer. The saturation current suppression layer is above the first-conductivity-type layer. The saturation current suppression layer includes a first deep layer and a JFET portion. The first deep layer has a lengthwise direction defined as a first direction, and the first deep layer has the second conductivity type and has multiple sections aligned in a stripe pattern. The JFET portion has a lengthwise direction identical to the first direction, and the JFET portion has the first conductivity type. The JFET portion has multiple sections, which are aligned in the stripe pattern and are disposed in alternate arrangement with sections of the first deep layer. The current dispersion layer has the first conductivity type, and is disposed above the saturation current suppression layer. The base region has the second conductivity type, and is disposed above the current dispersion layer. The source region is disposed above the base region, and has the first conductivity type with an impurity concentration higher than the impurity concentration of the first-conductive-type layer. The contact region is disposed at a position different from the source region above the base region, and has the second conductivity type with an impurity concentration higher than an impurity concentration of the base region. The trench gate structures are aligned in a stripe pattern, and each of the trench gate structures has a lengthwise direction defined as a second direction intersecting the first direction. Each of the trench gate structures has a gate trench, a gate insulation film and a gate electrode. The gate trench penetrates the source region and the base region. The gate insulation film covers an inner wall surface of the gate trench. The gate electrode is disposed above the gate insulation film. The interlayer insulation film covers the gate electrode, and includes a contact hole for exposing the contact region and the source region. The source electrode is electrically connected to the source region through the contact hole. The drain electrode is disposed at a rear side of the semiconductor layer. The second deep layer is disposed among the trench gate structures and connected to the first deep layer. The second deep layer has a lengthwise direction identical to the second direction. The second deep layer is disposed at an entire region between adjacent two of the trench gate structures. The second deep layer has a width larger than or equal to a spacing between the adjacent two of the trench gate structures along a widthwise direction of each of the trench gate structures.

The width of the second deep layer is set so that the channel region is not intentionally formed in the portion where the second deep layer is formed. By setting the width dimension for the second deep layer as described above, the second deep layer is arranged at an entire region between adjacent two of the trench gate structures along the widthwise direction of the trench gate structure. Therefore, it is possible to prevent the channel region from being intentionally formed in the portion forming the second deep layer. Additionally, it is possible to suppress an increase in the on-resistance or threshold voltage due to a change in the area where the element operation is performed.

According to a second aspect of the present disclosure, a method manufactures a semiconductor device including a semiconductor element. The method includes: preparing a semiconductor layer having a first conductivity type or a second conductivity type; preparing and arranging a first-conductivity-type layer above the semiconductor layer; forming a saturation current suppression layer above the first-conductivity-type layer; forming a current dispersion layer having the first conductivity type above the saturation current suppression layer; forming a base region having the second conductivity type above the current dispersion layer; forming a source region above the base region; forming a contact region at a position different from the source region above the base region; forming trench gate structures aligned in a stripe pattern; forming an interlayer insulation film covering a gate electrode included in each of the trench gate structures; forming a source electrode electrically connected to the source region through the contact hole; forming a drain electrode at a rear side of the semiconductor layer; and forming at least one second deep layer among the plurality of trench gate structures by implanting ions to an entire region between adjacent two of the trench gate structures. The first-conductivity-type layer has the first conductivity type with an impurity concentration lower than an impurity concentration of the semiconductor layer. The saturation current suppression layer includes a first deep layer whose lengthwise direction is defined as a first direction and a JFET portion whose lengthwise direction is identical to the first direction. The first deep layer has the second conductivity type and has a plurality of sections aligned in a stripe pattern. The JFET portion has a plurality of sections aligned in the stripe pattern and disposed in alternate arrangement with the plurality of sections of the first deep layer. The source region has the first conductivity type with an impurity concentration higher than the impurity concentration of the first-conductive-type layer. The contact region has the second conductivity type with an impurity concentration higher than an impurity concentration of the base region. Each of the trench gate structures has a lengthwise direction defined as a second direction intersecting the first direction. Each of the trench gate structures includes: a gate trench that penetrates the source region and the base region; a gate insulation film that covers an inner wall surface of the gate trench; and the gate electrode that is arranged above the gate insulating film. The interlayer insulation film includes a contact hole for exposing the contact region and the source region. The second deep layer has a lengthwise direction identical to the second direction. The entire region has a width larger than or equal to a spacing between the adjacent two of the trench gate structures along a widthwise direction of each of the trench gate structures. The second deep layer is connected to the first deep layer.

By such a manufacturing method, the second deep layer can be arranged in the entire region between the side walls of the adjacent gate trenches. Therefore, it is possible to form a semiconductor device in which the channel region from being intentionally formed in the portion forming the second deep layer. Additionally, it is possible to suppress an increase in the on-resistance or threshold voltage due to a change in the area where the element operation is performed.

The technical elements disclosed herein are listed below. The following technical elements are applicable independently.

First Embodiment

The following describes a first embodiment. The present embodiment describes a SiC semiconductor device adopting silicon carbide for semiconductor material as an example.

However, the present embodiment may also be applied to a semiconductor device made of the other semiconductor material such as silicon (Si).

Figure 2:
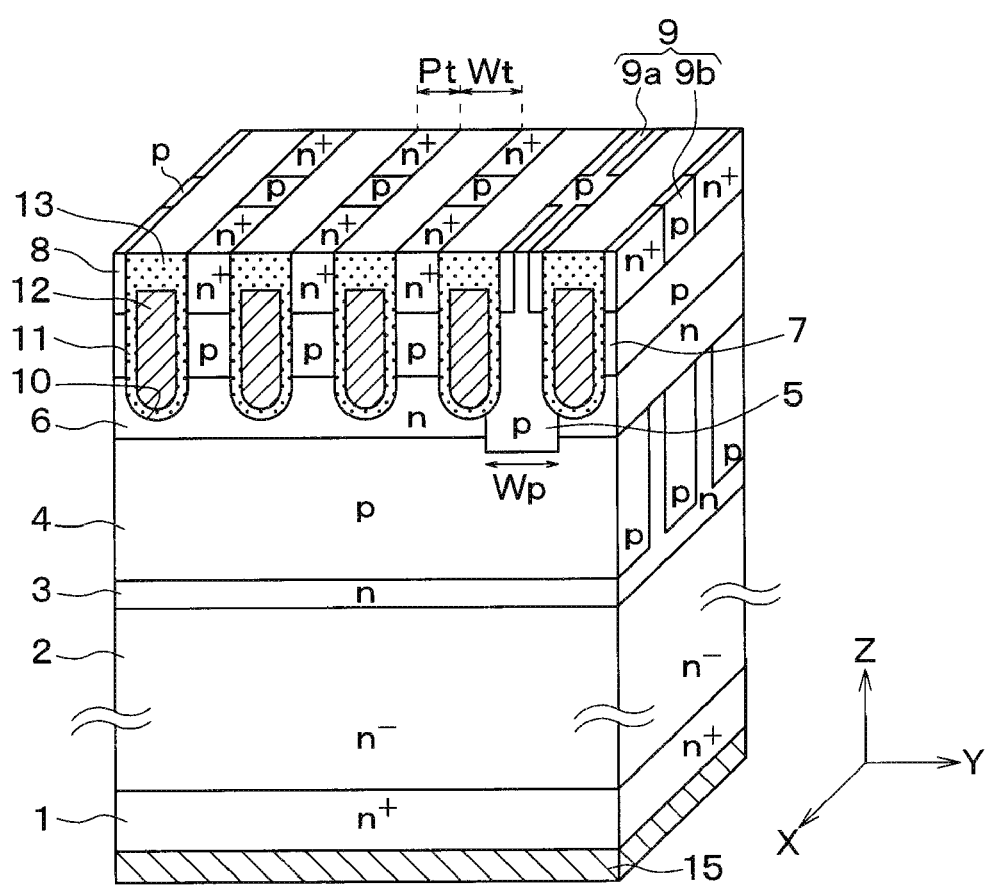
FIG. 2 is a perspective sectional view showing a part of the SiC semiconductor device shown in FIG. 1.

In a SiC semiconductor device according to the present embodiment, an inverted vertical MOSFET having a trench gate structure shown in FIGS. 1 and 2 is formed as a semiconductor device. The vertical MOSFET shown in those drawings is formed in a cell region of the SiC semiconductor device, and the SiC semiconductor device is configured by forming a withstand voltage maintaining structure so as to surround the cell region, but only the vertical MOSFET is shown in the drawings. As illustrated in FIGS. 1 and 2, an X-direction is orthogonal to a Y-direction, the Y-direction is orthogonal to a Z-direction, and the Z-direction direction is orthogonal to the X-direction. In particular, a widthwise direction of the vertical MOSFET may be referred to as an X-direction, a lengthwise direction of the vertical MOSFET crossing the X-direction may be referred to as a Y-direction, and a thickness direction or a depth direction of the vertical MOSFET, that is, the normal direction to the XY plane may be referred to as a Z-direction.

FIG. 2 is a perspective cross-sectional view of a portion of a cell region, but a part of the configuration of the SiC semiconductor device is omitted in order to make the layout of each part easily understandable.

As shown in FIGS. 1 and 2, an $n^+$-type substrate 1 made of SiC is used as a semiconductor substrate in a SiC semiconductor device. An $n^-$-type layer 2 is formed above the main surface of the $n^+$-type substrate 1. The $n^-$-type layer 2 is included in a portion of a drift layer having a lower concentration than the $n^+$-type substrate 1. The $n^+$-type substrate 1 corresponds to a semiconductor layer, and the $n^-$-type layer 2 corresponds to a first-conductive-type layer.

In the cell region, an n-type JFET portion 3 (hereinafter simply referred to as a JFET portion 3) and a p-type first deep layer 4 (hereinafter referred to as a first deep layer 4) included in a portion of the drift layer made of SiC are formed above the $n^-$-type layer 2. The $n^-$-type layer 2 is connected to the JFET portion 3 at a side facing the $n^+$-type substrate 1.

The JFET portion 3 and the first deep layer 4 are included in a saturation current suppression layer, and are both extended along the Y-direction as a lengthwise direction and alternately and repeatedly aligned along the X-direction. In other words, at least a part of the JFET portion 3 and a part of the first deep layer 4 are shaped in multiple linear shapes, that is, stripes, as viewed in a normal direction to the main surface of the $n^+$-type substrate 1, and are alternately arranged.

In the present embodiment, the JFET portion 3 is formed below the first deep layer 4. For that reason, the stripe-shaped portions of the JFET portion 3 are connected to each other below the first deep layer 4, but each of the stripe-shaped portions is arranged between corresponding two of the multiple sections of the first deep layer 4.

The first deep layer 4 is made of a p-type impurity layer. The first deep layer 4 has a striped shape. Each portion of the linear shapes of the first deep layer 4 has a constant width, and the linear shapes are arranged at an equal interval. The p-type impurity concentration in the depth direction is constant.

An n-type current dispersion layer 6 is formed above the JFET portion 3 and the first deep layer 4. The n-type current dispersion layer 6 is included in a portion of the drift layer made of SiC. The n-type current dispersion layer 6 is a layer that allows a current flowing through a channel of the vertical MOSFET to spread in the Y-direction, as will be described later, and has, for example, a higher n-type impurity concentration than the $n^-$-type layer 2. However, it is not essential to set the impurity concentration higher than the $n^-$-type layer 2 for the n-type current dispersion layer 6. For example, the impurity concentration of the n-type current dispersion layer 6 may be identical to the impurity concentration of the $n^-$-type layer 2.

In the present embodiment, the drift layer is made of the $n^-$-type layer 2, the JFET portion 3 and the n-type current dispersion layer 6. The configuration of the drift layer may be arbitrary. For example, the drift layer may include a structure having a buffer layer between the $n^-$-type layer 2 and the $n^+$-type substrate 1.

A p-type base region 7 made of SiC is formed above the n-type current dispersion layer 6. An $n^+$-type source region 8 made of SiC is formed above the p type base region 7. The p-type base region 7 is set to have a lower p-type impurity concentration than the first deep layer 4. Additionally, the $n^+$-type source region 8 is set to have a higher n-type impurity concentration than the n-type current dispersion layer 6.

A $p^+$-type contact layer 9 is formed such that the surface of the $n^+$-type source region 8 reaches the p-type base region 7. The contact $p^+$-type layer 9 corresponds to a contact region that is set to have a higher p-type impurity concentration than the p-type base region 7. In the present embodiment, the $p^+$-type contact layer 9 includes a coupling layer 9a and a contact portion 9b. The coupling layer 9a is the portion having a linear shape whose lengthwise direction is along the X-direction. The contact portion 9b is the portion having a linear shape whose lengthwise direction is the Y-direction intersecting the X-direction. A second deep layer 5 is formed below the coupling layer 9a. The second deep layer 5 penetrates the p-type base region 7 and the n-type current dispersion layer 6 to connect the first deep layer 4. The second deep layer 5 is formed in a linear shape with the X-direction as the longitudinal direction together with the coupling layer 9a.

The coupling layer 9a and the second deep layer 5 connect the first deep layer 4 and a source electrode 14 to fix the first deep layer 4 at the source potential. The contact portion 9b sets the p-type base region 7 at the source potential. If the contact portion 9b is connected to the second deep layer 5, the first deep layer 4 can be fixed at the source potential through the p-type base region 7 and the second deep layer 5 from the contact portion 9b. In this case, the coupling layer 9a is not essential. However, the coupling layer 9a is provided for connecting the second deep layer 5 to the source electrode 14 in a wide region.

Figure 3:
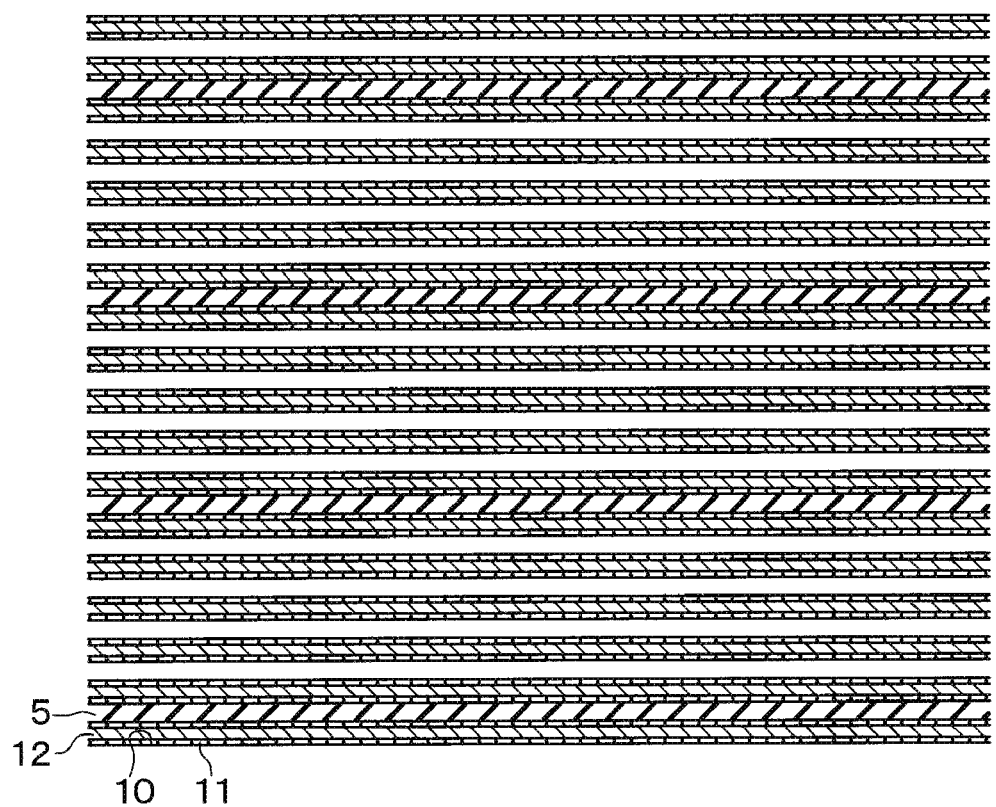
FIG. 3 is a top view illustrating a trench gate structure and a layout of a second deep layer.

The interval of forming multiple sections of the coupling layers 9a and the interval of forming the multiple sections of second deep layer 5 are arbitrary. However, in the present embodiment, the coupling layer 9a and the second deep layer 5 are formed in a group of several trench gate structures as one interval. For example, FIG. 3 illustrates that a group of five trench gate structures in which the second deep layer 5 is disposed is formed as one interval. The width of the coupling layer 9a is arbitrary. However, the width of the coupling layer 9a is set to be shorter than or equal to the spacing between adjacent two of the trench gate structures. Similar to the second deep layer 5, the coupling layer 9a may also be arranged to fill the entire space between the adjacent two of the trench gate structures. According to the above arrangement, even though misalignment occurs in the formation of the coupling layer 9a, the first deep layer 4 can be fixed to the source potential in a stable manner. The width of the second deep layer 5 is set to be larger than or equal to the spacing between the adjacent two of the trench gate structures. In other words, the entire region between the adjacent two of the trench gate structures along the widthwise direction of the trench gate structure, that is, the Y-direction is set to be the width of the second deep layer 5. The width of the second deep layer 5 is set such that the region below the n$^+$-type source region 8 or the coupling layer 9a is formed as the width of the second deep layer 5. The width of the second deep layer 5 is described in the following. The interval of forming the contact portion 9b is also arbitrary. However, if the forming interval is too wide, a portion in the p-type base region 7 where the distance to the contact portion 9b gets longer. Therefore, the formation interval is set so that the source potential can be reached over the entire p-type base region 7. Since the channel density is lowered in the portion where the contact portion 9b is formed, the forming interval of the contact portion 9b is set to suppress a decrease in the channel density.

The gate trench 10 is formed to penetrate the p-type base region 7 and the n$^+$-type source region 8 to reach the n-type current dispersion layer 6. The gate trench 10 has a predetermined width and a predetermined depth. The coupling layer 9a is arranged also at the p-type base region 7 and the n$^+$-type source region 8 so as to be in contact with the side surface of the gate trench 10. The gate trench 10 is formed in a strip-shaped layout in which the Y-direction in FIG. 2 is defined as a widthwise direction of the gate trench 10, the direction intersecting lengthwise direction of the JFET portion 3 and the first deep layer 4, in this case, the X-direction is defined as a lengthwise direction of the gate trench 10 intersecting the Y-direction, and the Z-direction is defined as a depth direction of the gate trench 10. As shown in FIGS. 1 to 2, the gate trenches 10 are formed in a stripe shape in which gate trenches 10 are arranged at equal intervals along the Y direction, and the p-type base region 7 and the n$^+$-type source 8 are interposed therebetween. However, in a region where the second deep layer 5 is formed, the p-type base region 7 between the gate trenches 10 is replaced with the second deep layer 5.

For example, the spacing between the trench gate structures, in other words, the spacing Pt between the side surface of the gate trench 10 and the side surface of the adjacent gate trench 10 is arbitrary. The spacing Pt may also be referred to as a distance between the side surface of the gate trench 10 and the side surface of the adjacent gate trench. However, the spacing Pt is set to be narrowed as 2 micrometers or shorter. For example, the spacing Pt is set to be 1 micrometer or shorter. The width Wt of the gate trench 10 is arbitrary. However, the width Wt is set to be smaller than the distance between the center position of the trench gate structure and the center position of the adjacent trench gate structure. For example, the width Wt is set to be in a range of 0.5 micrometer to 0.8 micrometer. The spacing between the adjacent two of the gate trenches 10 is a value obtained by subtracting the width Wt from a cell pitch.

The gate trenches 10 are formed in a stripe shape as viewed in a direction normal to the main surface of the n$^+$-type substrate 1, in other words, as viewed from above. However, the gate trenches may also be formed to have a least one portion formed in the stripe shape. For example, two adjacent gate trenches 10 with linear shape may be set as a group, and the gate trenches 10 may be laid out so that both ends of the gate trenches 10 are connected in a semicircular shape.

A portion of the p-type base region 7 located at the side surface of the gate trench 10 is a channel region connecting the n$^+$-type source region 8 and the n-type current dispersion layer 6 when the vertical MOSFET is operated. The inner wall surface of the trench 10 is covered with the gate insulating film 11. A gate electrode 12 made of doped Poly-Si is formed on a surface of the gate insulating film 11, and the gate trench 10 is filled with the gate insulating film 11 and the gate electrode 12 to form a trench gate structure. An interlayer insulating film 13 is formed so as to cover the gate electrode 12. The interlayer insulating film 13 may extend outside the gate trench 10. However, in the present embodiment, the interlayer insulating film 13 is disposed inside the gate trench 10, and the gate trench 10 is filled by the gate insulating film 11, the gate electrode 12 and the interlayer insulating film 13.

As shown in FIG. 1, a source electrode 14 and the like are formed on the surface of the n$^+$-type source region 8 and the surface of the gate electrode 12 via the interlayer insulating film 13. The source electrode 14 is made of multiple metals, for example, Ni/Al or the like. Among multiple metals, a portion that is in contact with at least the n-type SiC, specifically, the n$^+$-type source region 8 and the gate electrode 12 in the case of n-type doping, is made of a metal capable of ohmic contact with the n-type SiC. In addition, at least a portion contacting with, among the multiple metals, at least the p-type SiC, specifically, a portion contacting with the p$^+$-type contact layer 9 is made of a metal capable of ohmic contact with the p-type SiC. The source electrode 14 is formed on the interlayer insulating film 13 and is electrically insulated from the SiC portion, but is electrically in contact with the n$^-$-type source region 8 and the p$^+$-type contact layer 9 through the contact holes formed in the interlayer insulating film 13.

On the other hands, a drain electrode 15 electrically connected to the n$^-$-type substrate 1 is formed on a rear surface of the n$^+$-type substrate 1. With such a structure, the vertical MOSFET of an n-channel inverted type trench gate structure is provided. A cell region is formed by placing the vertical MOSFET cells described above.

The SiC semiconductor device including the vertical MOSFET configured as described above is operated by, for example, applying a gate voltage Vg of 20 V to the gate electrode 12 in a state where the source voltage Vs is 0 V and the drain voltage Vd is 1 to 1.5 V. That is, when the gate voltage Vg is applied, the vertical MOSFET performs an operation in which a channel region is formed in a portion of the p-type base region 7 that contacts with the gate trench 10 and a current flows between the drain and the source.

At this time, the JFET portion 3 and the first deep layer 4 function as a saturation current suppression layer, and it is possible to maintain a low saturation current while achieving a low on-state resistance by providing a saturation current suppression effect. Specifically, since the stripe shaped portions of the JFET portion 3 and the first deep layer 4 are alternately formed repeatedly, the following operation is performed.

First, when the drain voltage Vd is a voltage applied during normal operation, for example, 1 to 1.5 V, the depletion layer extending from the first deep layer 4 to the JFET portion 3 extends only to a width smaller than the width of the stripe shaped portion of the JFET portion 3. For that reason, even if the depletion layer extends into the JFET portion 3, a current path is secured. If the n$^-$-type impurity concentration of the JFET portion 3 is set to be higher than the concentration of the n$^-$-type layer 2, it is possible that the current path can be configured to have a low resistance, and a low on-resistance can be achieved.

When the drain voltage Vd becomes higher than the drain voltage Vd at the time of normal operation due to a load short-circuiting or the like, the depletion layer extending from the first deep layer 4 to the JFET portion 3 extends more than the width of the stripe shaped portion of the JFET portion 3. Then, the JFET portion 3 is immediately pinched off before the n-type current dispersion layer 6. As a result, it is possible to maintain a low saturation current and enhance the withstand capacity of the SiC semiconductor device due to, for example, a load short circuit.

In this way, the JFET portion 3 and the first deep layer 4 function as a saturation current suppression layer, and exhibit a saturation current suppression effect, thereby providing a SiC semiconductor device that can achieve both low on-state resistance and low saturation current.

Further, by providing the first deep layer 4 so as to sandwich the JFET portion 3, the stripe shaped portions of the JFET portion 3 and the first deep layer 4 are alternately and repeatedly formed. Therefore, even when the drain voltage Vd becomes a high voltage, the extension of the depletion layer extending from the bottom to the n⁻-type layer 2 is suppressed by the first deep layer 4. Thus, it may be possible to prevent the depletion layer from extending into the trench gate structure. Therefore, an electric field control effect for lowering the electric field applied to the gate insulating film 11 can be exhibited, and the gate insulating film 11 can be inhibited from being broken, so that a highly reliable element with high withstand voltage can be obtained. In addition, since the extension of the depletion layer to the trench gate structure can be prevented as described above, the n-type impurity concentration of the n-type layer 2 and the JFET portion 3 can be made relatively high, and a low on-resistance can be achieved.

Therefore, the SiC semiconductor device having a vertical MOSFET with low on-resistance and high reliability can be provided.

The SiC semiconductor device in the present embodiment includes the semiconductor element of a normally-off type in which no current flows between the drain and the source when the gate voltage Vg is not applied, since the channel region is not formed. The JFET portion 3 is of a normally-on type because it pinches off only when the drain voltage Vd is higher than the voltage during normal operation, even in the case of non-application of the gate voltage Vg.

In order to perform the above operation, it is necessary that the first deep layer 4 is accurately fixed to the source potential. However, in the present embodiment, the first deep layer 4 is fixed to the source potential through the coupling layer 9a and the second deep layer 5. Therefore, the SiC semiconductor device according to the present embodiment can perform the operation described above accurately.

Figure 4A:
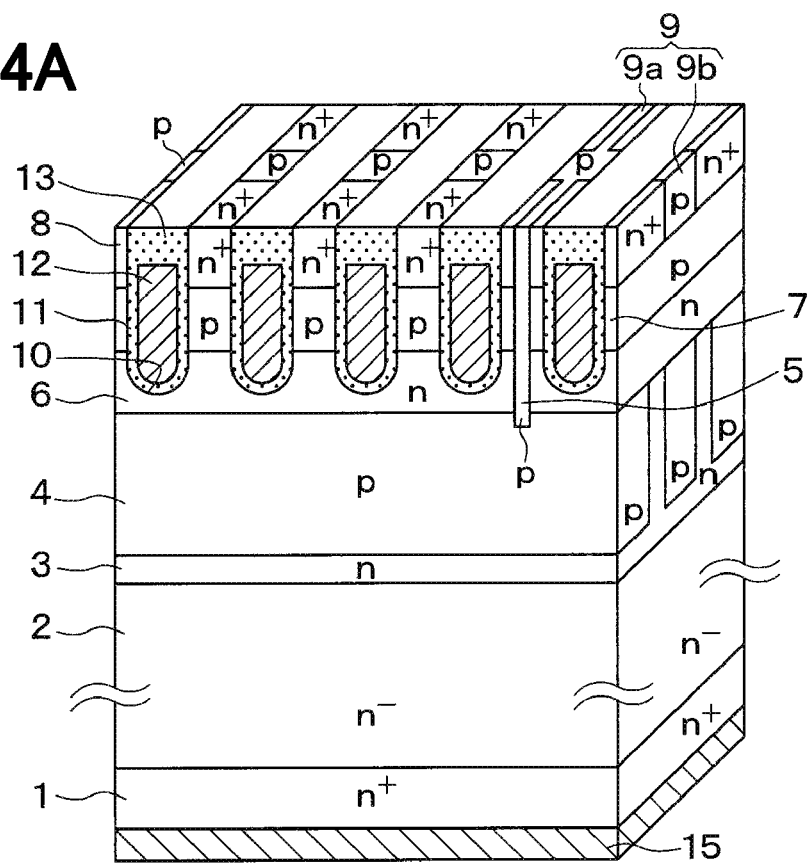
FIG. 4A is a perspective view of a SiC semiconductor device showing a state in which the width of the second deep layer is relatively narrow in a comparative example.

In this embodiment, the second deep layer 5 is included when the first deep layer 4 is fixed to the source potential. However, it is typically considered that the channel region is formed at a position where the second deep layer 5 is formed. As illustrated in FIG. 4A, the width of the second deep layer 5 is shorter than the spacing Pt between adjacent gate trenches 10, and the p-type base region 7 is inverted at the side surface of the trench gate structure located at both sides of the second deep layer 5 and the channel region is formed.

Figure 4B:
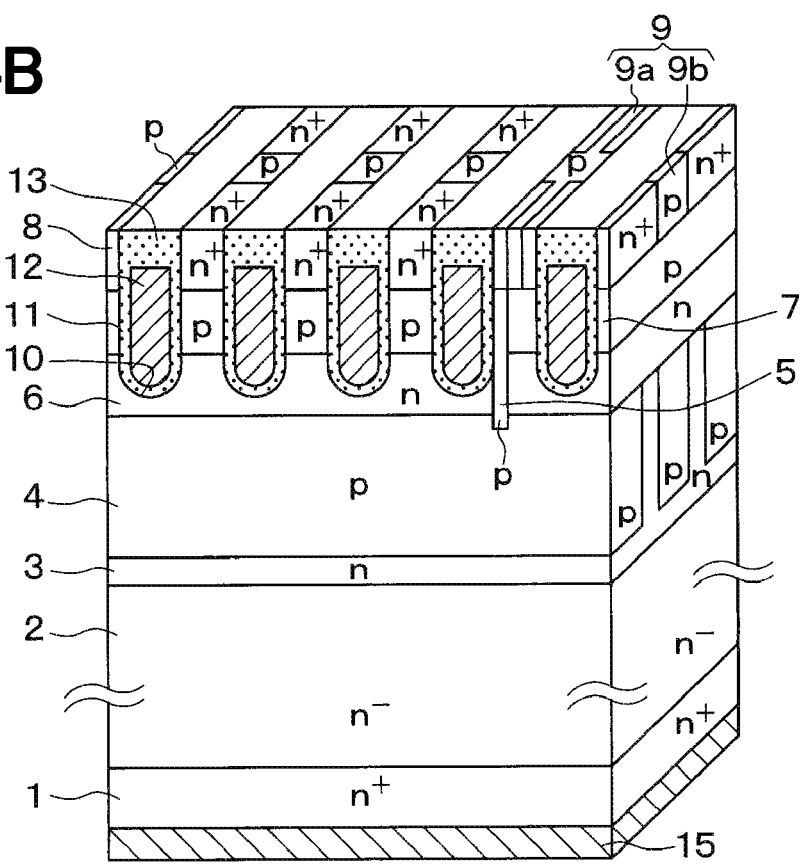
FIG. 4B is a perspective view of the SiC semiconductor device showing a state in which a shift in a forming position of the second deep layer occurs in the comparative example in FIG. 4A.

As illustrated in FIG. 4B, when a shift in the forming position of the second deep layer 5 occurs, the variation in the on-resistance Ron and the threshold voltage Vth increases. As the distance between the gate trenches 10 included in the trench gate structure is shortened, a mask for forming the second deep layer 5 by ion implantation is opened narrowly. However, it is difficult to enhance the processing precision, and it may cause a shift in the forming position of the second deep layer 5. In this situation, for example, if the second deep layer 5 is in contact with the side surface of the gate trench 10, the p-type impurity concentration of the contact portion becomes higher than the p-type base region, and the channel region is not formed during the MOSFET operation. Therefore, the area where the MOSFET operation is performed varies depending on whether or not the shift in the forming position of the p-type semiconductor occurs and the on-resistance Ron fluctuates. Due to the shift in the forming position, the concentration of p-type impurities in the p-type base region 7 is substantially increased around the portion where the second deep layer 5 is formed. Therefore, it leads to an increase in the variation of the threshold voltage Vth.

In the present embodiment, the width of the second deep layer 5, in other words, the dimension in the Y-direction is set such that the channel is not intentionally formed in the portion where the second deep layer 5 is formed and the MOSFET operation is not performed in that portion. The width Wp of the second deep layer 5 is set to be larger than or equal to the spacing Pt between the gate trenches 10. By setting the dimension of the width Wp as described above, the second deep layer 5 is disposed at the entire region between the side walls of the adjacent gate trenches 10 along the Y-direction. Therefore, it is possible to prevent the channel region from being intentionally formed in the portion forming the second deep layer 5. Additionally, it is possible to suppress an increase in the on-resistance or threshold voltage due to a change in the area where the MOSFET operation is performed.

Additionally, the width Wp of the second deep layer 5 may be set to a dimension in consideration of the shift in the forming position of the second deep layer 5. For example, in a situation where the second deep layer 5 is formed by ion implantation or the like, the shift in the forming position of the second deep layer 5 may occur due to the influence of mask displacement or the like. Therefore, it may be possible to set the width Wp of the second deep layer 5 to the dimension obtained by adding the deviation amount D of the forming position to the spacing Pt between the gate trenches 10. In other words, the width Wp of the second deep layer 5 may be set to satisfy the mathematical relation of Pt+D<Wp.

However, it is essential to set the width Wp of the second deep layer 5 to prevent the second deep layer 5 from being formed between particular adjacent two of the gate trenches 10, and to prevent the second deep layer 5 from being formed to a section adjacent to the particular adjacent two of the adjacent gate trenches 10. Therefore, the width Wp of the second deep layer 5 is set to be shorter than the sum of the respective widths Wt of the two gate trenches 10 and the spacing Pt between the adjacent gate trenches 10. In other words, the width Wp may be set to satisfy the mathematical relation of Wp<Pt+2Wt. Additionally, the width Wp of the second deep layer 5 may be set to satisfy the mathematical relation of Wp<Pt+2Wt-D, in consideration of the deviation amount D of the forming position of the second deep layer 5.

The shift in the forming position of the second deep 5 does not refer to the misalignment with reference to an alignment mark (not shown) in the formation of the second deep layer 5, it refers to the misalignment of the second deep layer 5 with respect to the gate electrode 10. In other words, the misalignment of the formation of the gate trench 10 may also occur, both of the misalignment of the formation of the second deep layer 5 and the misalignment of the formation of the gate trench 10 affects a shift in the relative position of the second deep layer 5 with respect to the gate trench 10. The width Wp of the second deep layer 5 is set based on the maximum value of both of the positional shift of the formation of the gate trench 10 and the positional shift of the formation of the second deep layer 5 as the deviation amount D. However, it is not necessary to take into consideration of the deviation amount D as the maximum value of the shift in the forming position. It is sufficient to set the width Wp of the second deep layer 5 in consideration of the deviation amount D.

Next, a method of manufacturing the SiC semiconductor device including the vertical MOSFET of the n-channel type inverted trench gate structure according to the present embodiment will be described with reference to cross-sectional views of the SiC semiconductor device during a manufacturing process shown in FIGS. 5A to 5H.

Figure 5A:
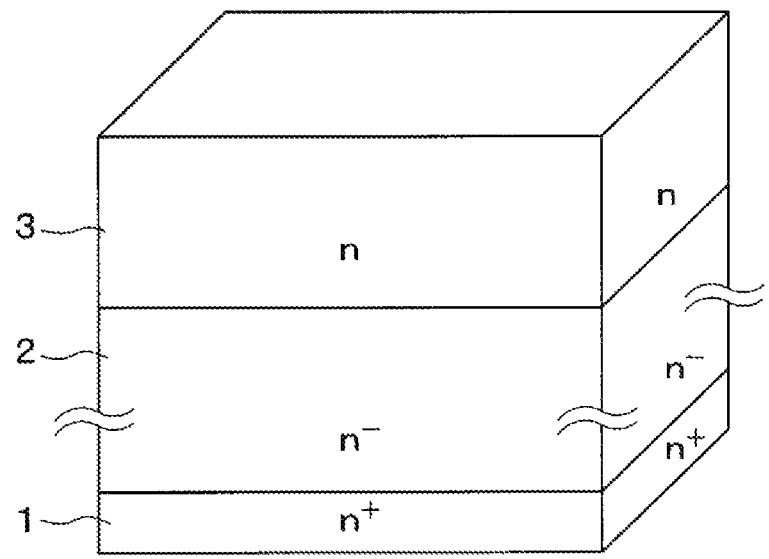
FIG. 5A is a perspective cross-sectional view illustrating a manufacturing process of the SiC semiconductor device shown in FIG. 2.

(Process in FIG. 5A)

First, the $n^+$-type substrate 1 made of, for example, SiC is prepared as a semiconductor substrate. Then, an $n^-$-type layer 2 made of SiC is formed on the main surface of the $n^+$-type substrate 1 by epitaxial growth using a CVD (chemical vapor deposition) apparatus (not shown). At this time, a so-called epitaxial substrate in which the $n^-$-type layer 2 is grown in advance on the main surface of the $n^+$-type substrate 1 may be used. The JFET portion 3 made of SiC is epitaxially grown on the $n^-$-type layer 2.

Figure 5B:
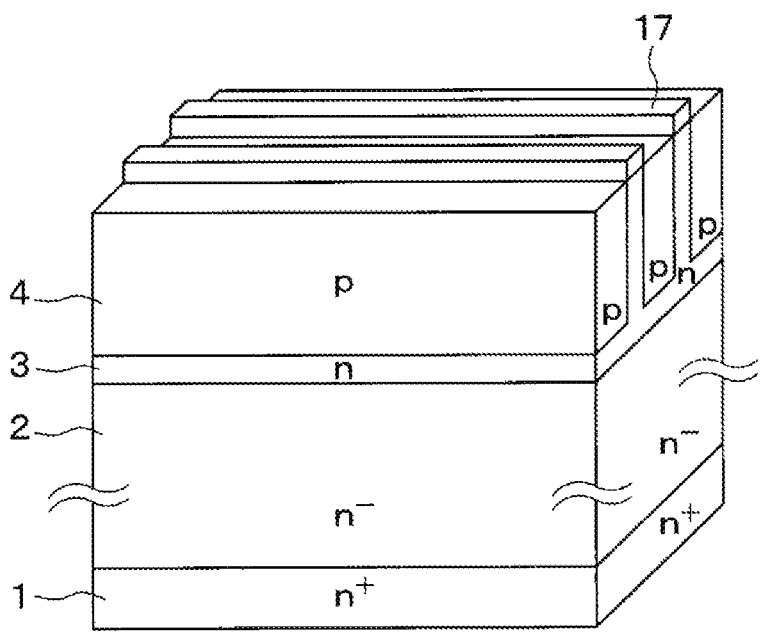
FIG. 5B is a perspective sectional view showing a manufacturing process of the SiC semiconductor device following FIG. 5A.

(Process in FIG. 5B)

The first deep layer 4 is formed at a predetermined region of the JFET portion 3. After a mask 17 made of an oxide film or the like is disposed on a surface of the JFET portion 3, the mask 17 is patterned to open a region where the first deep layer 4 is to be formed. Then, the p-type impurity is ion-implanted to form the first deep layer 4. Thereafter, the mask 17 is removed.

Although the first deep layer 4 is formed by ion implantation in this example, the first deep layer 4 may be formed by a method other than ion implantation. For example, the JFET portion 3 is selectively anisotropically etched to form a recess portion at a position corresponding to the first deep layer 4, a p-type impurity layer is epitaxially grown on the concave portion, and then the p-type impurity layer is flattened at a portion located on the JFET portion 3 to form the first deep layer 4. In this manner, the first deep layer 4 can also be formed by epitaxial growth.

Figure 5C:
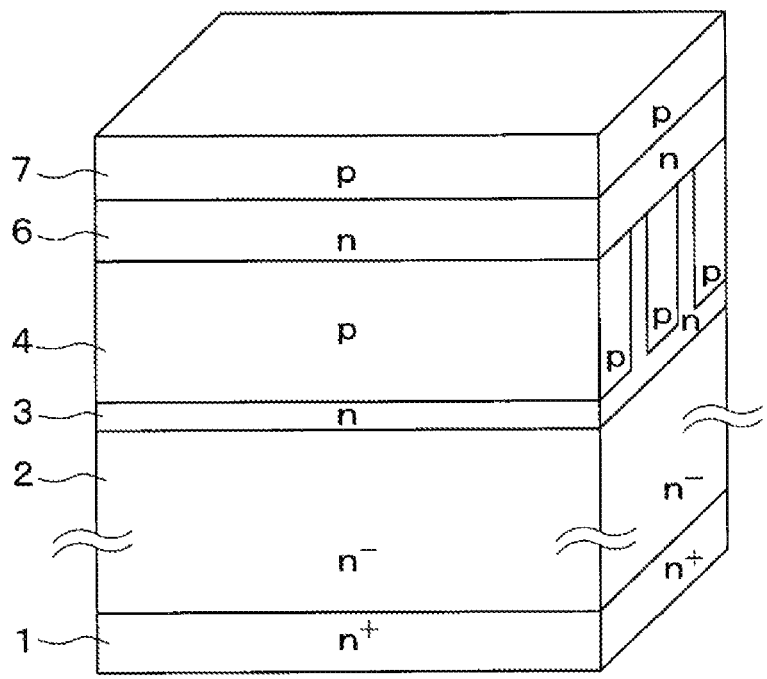
FIG. 5C is a perspective sectional view showing a manufacturing process of the SiC semiconductor device following FIG. 5B.

(Process in FIG. 5C)

Subsequently, by using a chemical vapor deposition (CVD) apparatus (not shown), n-type SiC is epitaxially grown on the JFET portion 3 and the first deep layer 4 to form the n-type current dispersion layer 5.

The p-type base region 7 is epitaxially grown on the n-type current dispersion layer 6.

Figure 5D:
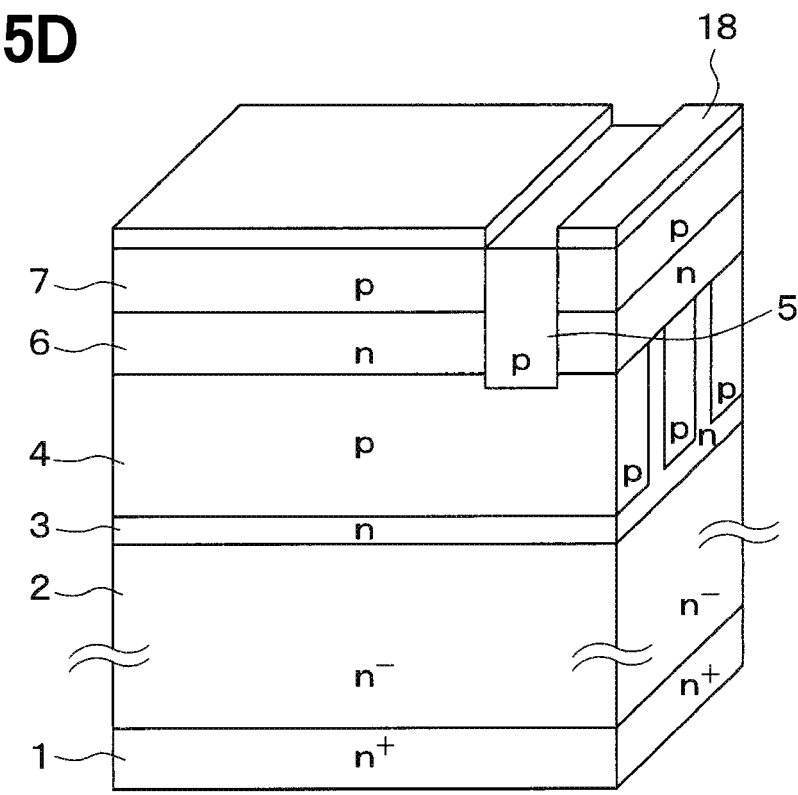
FIG. 5D is a perspective sectional view showing a manufacturing process of the SiC semiconductor device following FIG. 5C.

(Process in FIG. 5D)

A mask 18 made of an oxide film or the like having an opening at a position corresponding to the second deep layer 5 above the p-type base region 7. Then, the p-type impurity is ion-implanted to form the second deep layer 5 with the mask 18. Thereafter, the mask 18 is removed.

Figure 5E:
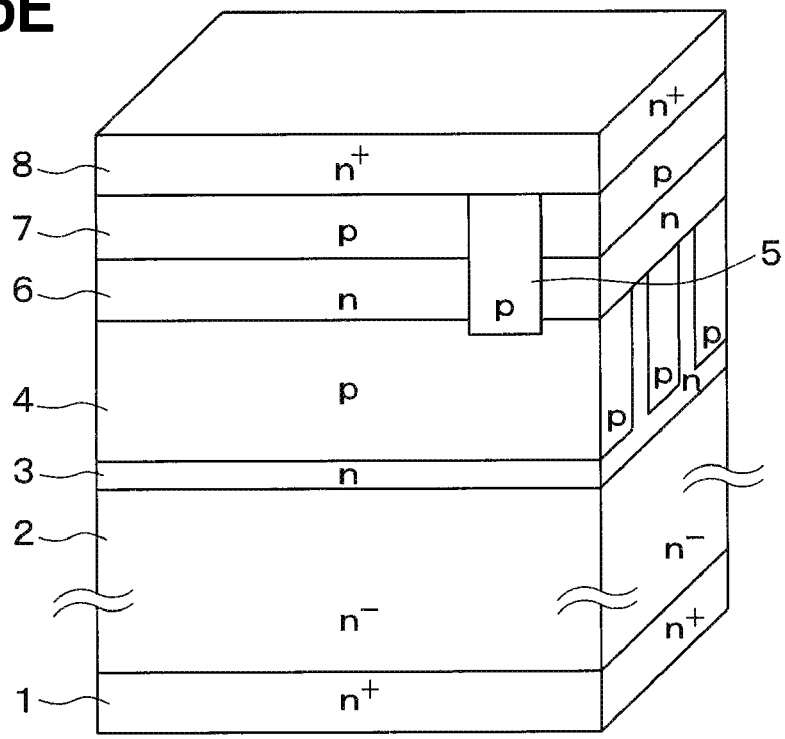
FIG. 5E is a perspective sectional view showing a manufacturing process of the SiC semiconductor device following FIG. 5D.

(Process in FIG. 5E)

The $n^+$-type source region 8 is epitaxially grown on the second deep layer 5 and the p-type base region 7.

Figure 5F:
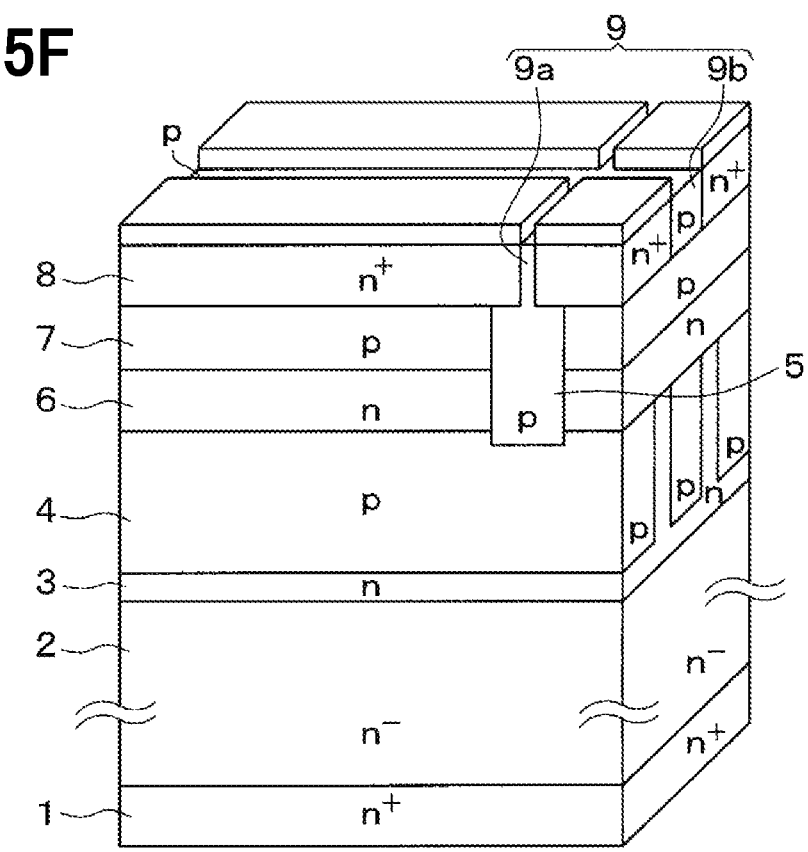
FIG. 5F is a perspective sectional view showing a manufacturing process of the SiC semiconductor device following FIG. 5E.

(Process in FIG. 5F)

A mask 19 having an opening corresponding to the $p^+$-type contact layer 9 is formed on the $n^+$-type source region 8. The $p^+$-type contact layer 9 including the coupling layer 9a and the contact portion 9b is formed through ion-implantation of p-type impurity by using the mask 19. Thereafter, the mask 19 is removed.

Figure 5G:
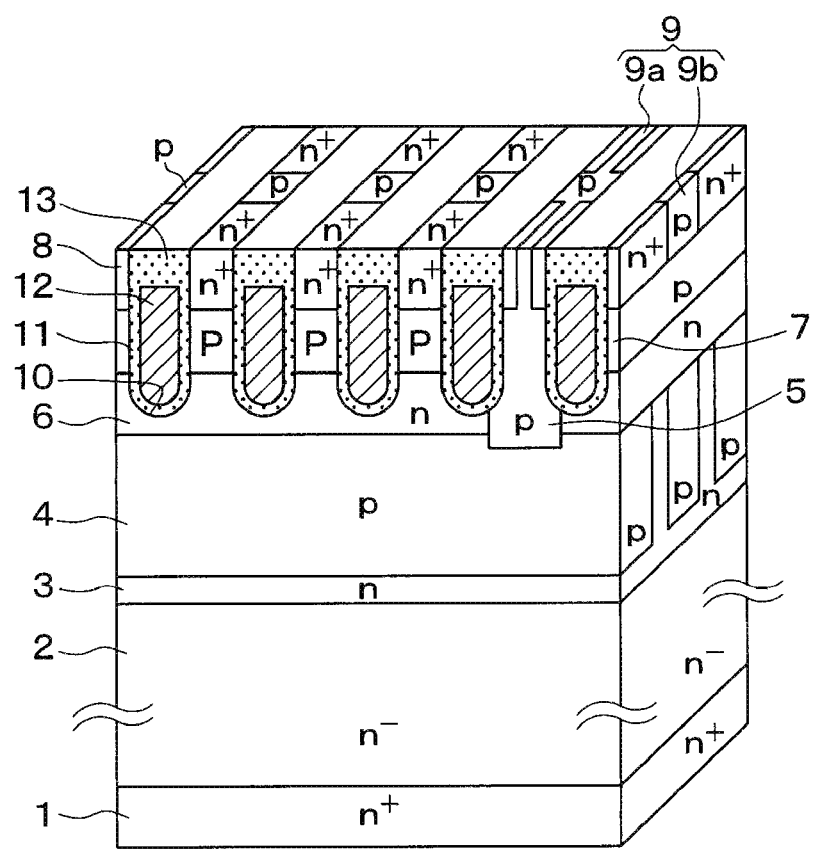
FIG. 5G is a perspective sectional view showing a manufacturing process of the SiC semiconductor device following FIG. 5F.

(Process in FIG. 5G)

After a mask (not shown) is formed above the $n^+$-type source region 8 and the like, an opening is made at a portion of the mask where the gate trench 10 is to be formed. Then, the gate trench 10 is formed by performing anisotropic etching process such as RIE using a mask.

Thereafter, after the mask is formed, for example, the deposition of the oxide film or thermal oxidation is performed to form the gate insulating film 11, so that the gate insulation film 11 covers an inner wall surface of the gate trench 10 and the surface of the $n^+$-type source region 8. Then, a Poly-Si doped with a p-type impurity or an n-type impurity is deposited, and then etched back to leave the Poly-Si in the gate trench 10, thereby forming the gate electrode 12. As a result, the trench gate structure is completed.

In other words, the interlayer insulating film 13 made of, for example, an oxide film is formed so as to cover the surfaces of the gate electrode 12 and the gate insulating film 11. The interlayer insulating film 13 is etched with a mask (not shown) until the $n^+$-type source region 8 and the $p^+$-type contact layer 9 are exposed, and the contact hole is formed and the interlayer insulating film 13 inside the gate trench gate 13 remains.

Though not shown in the figure, the following processes are performed. Then, after the electrode material provided by, for example, a laminated structure of multiple metals is formed on the surface of the interlayer insulation film 13, the source electrode 14 is formed by patterning the electrode material. Furthermore, the drain electrode 15 is formed on the back side of the $n^+$-type substrate 1. In this manner, the SiC semiconductor device according to the present embodiment is completed.

In the SiC semiconductor device according to the present embodiment, the width of the second deep layer 5, in other words, the dimension in the Y-direction is set, such that the channel is not intentionally formed in the portion where the second deep layer 5 is formed and the MOSFET operation is not performed in that portion. The width Wp of the second deep layer 5 is set to be larger than or equal to the spacing Pt between the adjacent two of the gate trenches 10. By setting the dimension of the width Wp as described above, the second deep layer 5 is disposed at the entire region between the respective side walls of the adjacent two of the gate trenches 10 in the Y-direction. Therefore, it is possible to prevent the channel region from being intentionally formed in the portion forming the second deep layer 5. Additionally, it is possible to suppress an increase in the on-resistance or threshold voltage due to a change in the area where the MOSFET operation is performed.

Additionally, the width Wp of the second deep layer 5 is set to be shorter than the sum of the widths Wt of the adjacent two of the gate trenches 10 and the spacing Pt between the adjacent two of the gate trenches 10. In other words, the width Wp may be set to satisfy the mathematical relation of Wp<Pt+2Wt. As a result, it is possible to set the width Wp of the second deep layer 5 to prevent the second deep layer 5 from being formed to a specific trench gate 10, and to prevent the second deep layer 5 from being formed to the adjacent gate trench 10.

Second Embodiment

The following describes a second embodiment. The present embodiment is a modification in which the layout of the second deep layer 5 is changed from the first embodiment, and similar to the first embodiment except the modified part, so that only portions different from those in the first embodiment will be described.

In the first embodiment, each of the multiple sections of the second deep layer 5 is formed among a group of several trench gate structures as one interval. For example, as shown in FIG. 3, each of the multiple sections of the second deep layer 5 is disposed among a group of five trench gate structures, such that the formation density of the multiple sections of the second deep layer 5 inside the cell region is uniform. In other words, the multiple sections of the second deep layer 5 are disposed at equal intervals inside the cell region.

Figure 6:
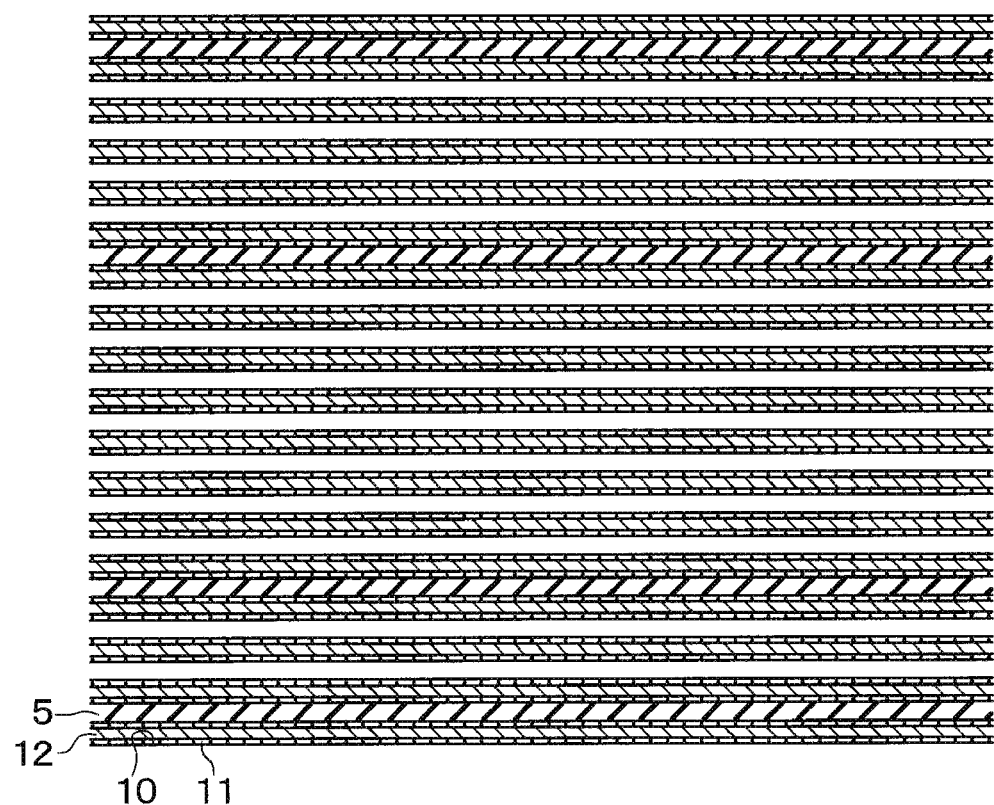
FIG. 6 is a top view of the layout of the trench gate structure and the second deep layer described in a second embodiment.

On the other hand, in the present embodiment, the multiple sections of second deep layer 5 are respectively formed among several groups of the trench gate structures while the multiple sections of second deep layer 5 are disposed at unequal intervals. For example, as illustrated in FIG. 6, a first one of the multiple sections of second deep layer 5 is placed among a group of three trench gate structures, a second one of the multiple sections of second deep layer 5 is among a group of five trench gate structures, and a third one of the multiple sections of second deep layer 5 is placed among a group of eight trench gate structures. As described above, it is possible to vary the arrangement intervals of the multiple sections of second deep layer 5.

Third Embodiment

A third embodiment will be described. The present embodiment is a modification in which the forming position of the second deep layer 5 is changed from the first embodiment, and similar to the first embodiment except the modified part, so that only portions different from those in the first embodiment will be described.

Figure 7A:
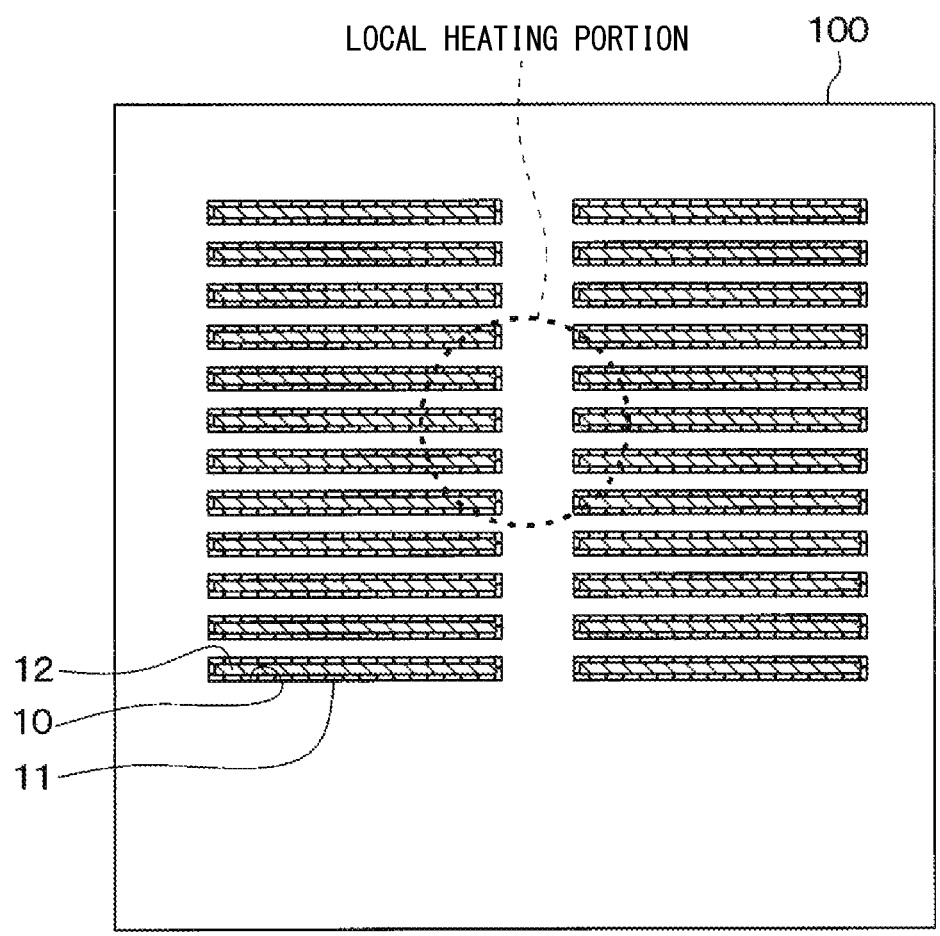
FIG. 7A illustrates the layout of the trench gate structure inside a semiconductor chip and a portion where the temperature is locally high.
Figure 7B:
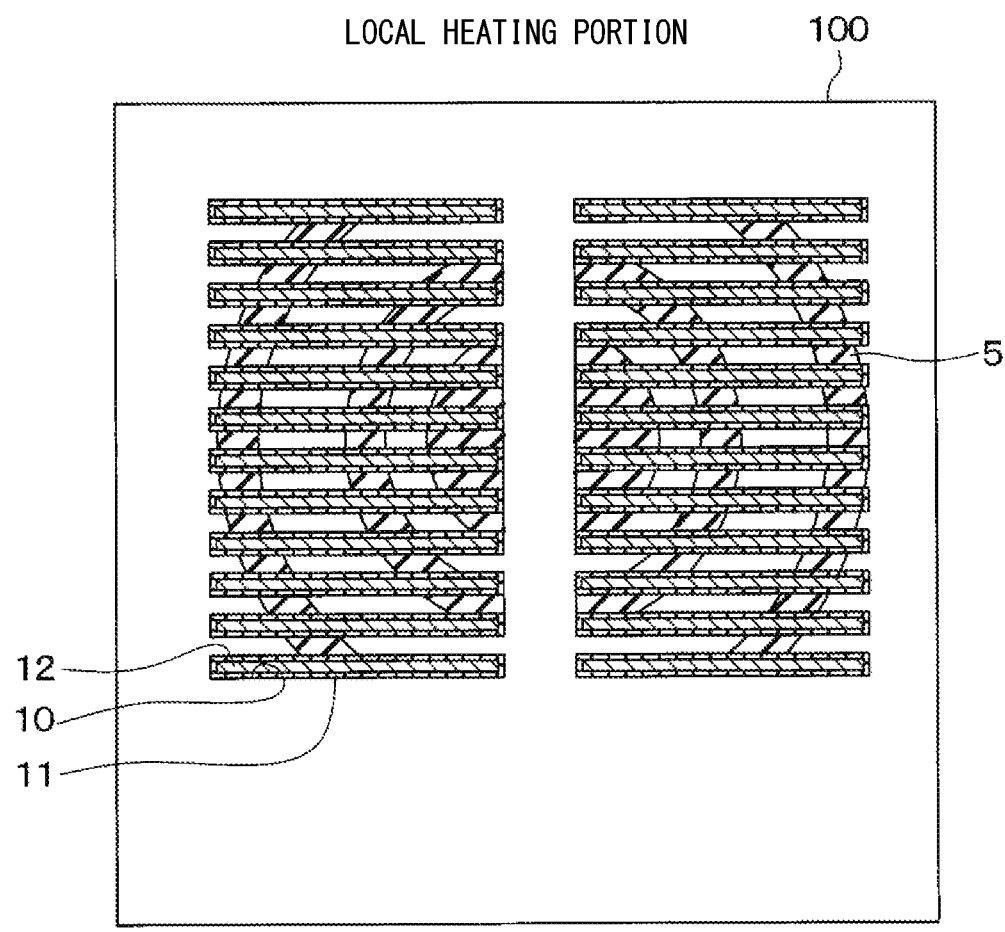
FIG. 7B is a top view of the semiconductor chip showing an example of the layout of the second deep layer that avoids local high temperature.

As illustrated in FIG. 7A, in a situation where the SiC semiconductor device having a MOSFET with a trench gate structure is included in the semiconductor chip 100, the center of the cell region tends to have a high temperature, and the temperature gradually decreases as deviated from the center of the cell region. The heat is dissipated toward the outer peripheral side of the cell region. However, the heat cannot be easily dissipated and is concentrated in the center of the cell region. The density of disposing the multiple sections of second deep layer 5 at a portion where the temperature tends to be high is increased to suppress the deviation of temperature inside the cell region. As illustrated in FIG. 7B, a first one of the multiple sections of second deep layer 5 is arranged in a circular shape at the center of the cell region. In addition, a second one of the multiple sections of second deep layer 5 and a third one of the multiple sections of second deep layer 5 are arranged concentrically around the center of the cell region. The arrangement interval of the multiple sections of second deep layer 5 is widened as deviated from the center of the cell region. By arranging the multiple sections of second deep layer 5 corresponding to the temperature distribution in a situation where the multiple sections of second deep layer 5 are not formed, it is possible to suppress the deviation of the temperature inside the cell region, and it is possible to suppress local heating.

Other Embodiments

While the present disclosure has been described in accordance with the embodiment described above, the present disclosure is not limited to the embodiment and includes various modifications and equivalent modifications. In addition, while the various elements are shown in various combinations and configurations, which are exemplary, other combinations and configurations, including more, less or only a single element, are also within the spirit and scope of the present disclosure.

In the first embodiment, the first deep layer 4 is formed by forming the first deep layer 4 with an ion-implanted layer. In other words, the first deep layer 4 is formed through the ion-implantation of the p-type impurity after the formation of the JFET portion 3. On the other hand, the JFET portion 3 may be formed by forming the JFET portion 3 with an ion-implanted layer. In other words, the JFET portion 3 may be formed through ion-implantation of the n-type impurity subsequent to the epitaxial growth of the first deep layer 4 above the n$^-$-type layer 2.

In the embodiments described above, the section between adjacent two gate trenches 10 is made as the second deep layer 5. However, the section across three or more consecutive gate trenches 10 may be made as the second deep layer 5. However, in this situation, since the channel region cannot be formed at two or more regions between the adjacent gate trenches 10, it is possible to increase the current density per unit area in the structure according to the first embodiment.

In the embodiments described above, the case in which SiC is used as the semiconductor material has been described, but the present disclosure can also be applied to a semiconductor device using other semiconductor materials such as Si or a compound semiconductor.

In the embodiments described above, the second deep layer 5 is formed through ion-implantation of the p-type base region 7 and the n-type current dispersion layer 6 from the surface of the p-type base region 7. Additionally, the coupling layer 9a and the contact portion 9b are formed at the same time. Such a manufacturing method is particularly effective when a semiconductor material such as SiC in which the injected ions are not diffused by heat treatment is used. In a situation where a semiconductor material such as silicon (Si) in which ions are diffused by heat treatment is used, the coupling layer 9a and the contact portion 9b may be separately formed, and the coupling layer 9a and the second deep layer 5 may be formed at the same time by using a mask disposed at the surface of the n$^+$-type source region 8.

In the embodiments described above, the n$^+$-type substrate 1 as a semiconductor layer is prepared, and the n$^-$-type layer 2 corresponding to the n-type conductivity type layer is epitaxially grown on the n$^+$-type substrate 1. However, the above method is merely an example. The n$^-$-type layer 2 may be used as the semiconductor substrate, and the semiconductor layer may be formed to have a higher impurity concentration than the n$^-$-type layer 2 by implanting ions at the rear surface of the n$^-$-type layer 2.

In the above-described embodiment, an n channel-type vertical MOSFET in which the first conductivity type is n-type and the second conductivity type is p-type has been described as an example. Alternatively, the conductivity type of each element may be reversed so as to form a p-channel type vertical MOSFET. In the above description, the vertical MOSFET is described as an example of the semiconductor element. Alternatively, the present disclosure may also be applied to an IGBT having a similar structure. In the case of the n-channel type IGBT, the conductivity type of the n$^+$-type substrate 1 is changed from the n-type substrate to the p-type substrate in each of the above embodiments, and the structures and manufacturing methods are the same as those in each of the above embodiments, except that the conductivity type of the n$^+$-type substrate 1 is changed from the n-type substrate to the p-type substrate. Although the trench gate structure is described as an example in the present description, a planar type MOSFET or IGBT may be adopted, and an element other than MOSFET and IGBT may also be adopted.

What is claimed is:

1. A semiconductor device comprising:
a semiconductor element includes:
a semiconductor layer having a first conductivity type or a second conductivity type;
a first-conductivity-type layer disposed above the semiconductor layer, and having the first conductivity type with an impurity concentration lower than an impurity concentration of the semiconductor layer;
a saturation current suppression layer disposed above the first-conductivity-type layer, and including
a first deep layer whose lengthwise direction is defined as a first direction, the first deep layer having the second conductivity type and having a plurality of sections aligned in a stripe pattern, and
a JFET portion whose a lengthwise direction is identical to the first direction, the JFET portion having the first conductivity type, the JFET portion having a plurality of sections aligned in a stripe pattern and disposed in alternate arrangement with the plurality of sections of the first deep layer;
a current dispersion layer having the first conductivity type disposed above the saturation current suppression layer;
a base region having the second conductivity type and disposed above the current dispersion layer;
a source region disposed above the base region, and having the first conductivity type with an impurity concentration higher than the impurity concentration of the first-conductivity-type layer;
a contact region disposed at a position different from the source region above the base region, and having the second conductivity type with an impurity concentration higher than an impurity concentration of the base region;
a plurality of trench gate structures aligned in a stripe pattern, each of which has a lengthwise direction defined as a second direction intersecting the first direction, each of which includes
a gate trench penetrating the source region and the base region,
a gate insulation film covering an inner wall surface of the gate trench, and
a gate electrode disposed above the gate insulation film;
an interlayer insulation film covering the gate electrode, and including a contact hole for exposing the contact region and the source region;
a source electrode electrically connected to the source region through the contact hole;
a drain electrode disposed at a rear side of the semiconductor layer; and
a second deep layer disposed among the plurality of trench gate structures and connected to the first deep layer, the second deep layer having a lengthwise direction identical to the second direction, the second deep layer having a width larger than or equal to a spacing between adjacent two of the trench gate structures and disposed at an entire region between the adjacent two of the trench gate structures along a widthwise direction of each of the trench gate structures.

2. The semiconductor device according to claim 1, wherein the width of the second deep layer satisfies a mathematical relation of $Pt \leq Wp \leq Pt+2Wt$, where Wp denotes the width of the second deep layer, Pt denotes the spacing between the adjacent two of the trench gate structures, and Wt denotes a width of each of the adjacent two of the trench gate structures.

3. The semiconductor device according to claim 1, wherein the contact region includes:
a contact portion that has a linear shape intersecting the second direction, and that is in contact with the source electrode to fix the base region at a source potential; and
a coupling layer that has a linear shape whose lengthwise direction is identical to the second direction, and that is disposed above the second deep layer and is in contact with the source electrode to fix the first deep layer at the source potential through the second deep layer.

4. The semiconductor device according to claim 1, wherein the second deep layer includes a plurality of sections, and
wherein the plurality of sections of the second deep layer are respectively disposed for a plurality of groups of two or more of the trench gate structures such that the plurality of sections of the second deep layer are disposed at equal intervals among the trench gate structures.

5. The semiconductor device according to claim 1, wherein the second deep layer includes a plurality of sections, and
wherein a first one of the plurality of sections of the second deep layer is disposed at a center of a cell region where the semiconductor element is disposed, and remaining one or more of the plurality of sections of the second deep layer are disposed concentrically with respect to the first one disposed at the center.

6. The semiconductor device according to claim 3, wherein the second deep layer includes a plurality of sections, and
wherein the plurality of sections of the second deep layer are respectively disposed for a plurality of groups of two or more of the trench gate structures such that the plurality of sections of the second deep layer are disposed at equal intervals among the trench gate structures.

7. The semiconductor device according to claim 3, wherein the second deep layer includes a plurality of sections, and
wherein a first one of the plurality of sections of the second deep layer is disposed at a center of a cell region where the semiconductor element is disposed, and remaining one or more of the plurality of sections of the second deep layer are disposed concentrically with respect to the first one disposed at the center.

* * * * *